(12) United States Patent
Makimoto et al.

(10) Patent No.: US 11,121,685 B2
(45) Date of Patent: Sep. 14, 2021

(54) OPERATIONAL AMPLIFIER

(71) Applicant: Rohm Co., Ltd., Kyoto (JP)

(72) Inventors: Hiroyuki Makimoto, Kyoto (JP); Yusuke Yoshii, Kyoto (JP); Yuki Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/640,321

(22) PCT Filed: Aug. 6, 2018

(86) PCT No.: PCT/JP2018/029357
§ 371 (c)(1),
(2) Date: Feb. 19, 2020

(87) PCT Pub. No.: WO2019/039245
PCT Pub. Date: Feb. 28, 2019

(65) Prior Publication Data
US 2020/0358410 A1 Nov. 12, 2020

(30) Foreign Application Priority Data
Aug. 22, 2017 (JP) .............................. JP2017-159203

(51) Int. Cl.
*H03F 1/08* (2006.01)
*H03F 3/45* (2006.01)
(Continued)

(52) U.S. Cl.
CPC ........... *H03F 3/4508* (2013.01); *H03F 1/083* (2013.01); *H03F 3/19* (2013.01); *H03F 3/45179* (2013.01);
(Continued)

(58) Field of Classification Search
CPC ............ H03F 3/4508; H03F 2203/372; H03F 2203/45116; H03F 2203/45594;
(Continued)

(56) References Cited

U.S. PATENT DOCUMENTS

| 6,559,718 B2 * | 5/2003 | Kudo ................... H03F 3/3072 330/252 |
| 2001/0015674 A1 | 8/2001 | Kudo et al. |
| 2008/0248776 A1 * | 10/2008 | Banba .................. H03D 7/1483 455/327 |

FOREIGN PATENT DOCUMENTS

| JP | 5-102395 A | 4/1993 |
| JP | 5-267574 A | 10/1993 |

(Continued)

OTHER PUBLICATIONS

Japan Patent Office, International Search Report for PCT/JP2018/029357 dated Oct. 9, 2018, with English translation.

*Primary Examiner* — Jung Kim
(74) *Attorney, Agent, or Firm* — Fish & Richardson P.C.

(57) ABSTRACT

An operational amplifier 1 comprises transistors Q1 and Q2 forming an input stage, and input resistors R1 and R2 which form a filter together with parasitic capacitors C1 and C2 accompanying the transistors Q1 and Q2. Resistance values R of the resistors R1 and R2 may be set to $R=1/(2\pi \cdot fc \cdot C)$, where C is the capacitance value of each of the parasitic capacitors C1 and C2, and fc is the target cutoff frequency of the filter. The operational amplifier 1 may also include a power supply resistor R0 which forms a filter together with a parasitic capacitor C0 accompanying a power supply line.

20 Claims, 18 Drawing Sheets

(51) Int. Cl.
*H03F 3/19* (2006.01)
*B60R 16/02* (2006.01)

(52) U.S. Cl.
CPC ........ *B60R 16/02* (2013.01); *H03F 2200/129* (2013.01); *H03F 2200/372* (2013.01); *H03F 2200/451* (2013.01); *H03F 2203/45116* (2013.01); *H03F 2203/45594* (2013.01)

(58) Field of Classification Search
CPC ...... H03F 2200/451; H03F 1/083; H03F 3/19; H03F 2203/45612; H03F 3/45085; H03F 2203/45601; H03F 2203/45528; H03F 3/45475; H03F 1/26; H03F 3/45179; H03F 1/086; H03F 2200/129; B60R 16/02; H01L 27/0821
See application file for complete search history.

(56) References Cited

FOREIGN PATENT DOCUMENTS

| | | |
|---|---|---|
| JP | 7-29984 A | 1/1995 |
| JP | 2001-230639 A | 8/2001 |
| JP | 2011-9800 | 1/2011 |
| JP | 2013-16849 | 1/2013 |
| JP | 2014-191542 A | 10/2014 |

* cited by examiner

OPERATIONAL AMPLIFIER

TECHNICAL FIELD

The invention disclosed herein relates to an operational amplifier.

BACKGROUND ART

Operational amplifiers have conventionally been used in various fields.

An example of the conventional technology related to this is disclosed in Patent Document 1 identified below.

LIST OF CITATIONS

Patent Literature

Patent Document 1: Japanese Patent Application Published as No. 2011-9800

SUMMARY OF THE INVENTION

Technical Problem

However, the conventionally used operational amplifiers still have a lot to improve in terms of their noise characteristics. In particular, in the fields of industrial appliances and in-vehicle appliances, with the increase of the number of electronic components and the increase of the density of components, there has been growing demand for improvement of noise characteristics of operational amplifiers.

An object of the invention disclosed herein is, in view of the above described problems found by the inventors of the present invention, to provide an operational amplifier having excellent noise characteristics.

Means for Solving the Problem

An operational amplifier disclosed herein includes a transistor forming an input stage, and an input resistor forming a filter together with a parasitic capacitor of the transistor (a first configuration).

Preferably, in the operational amplifier having the first configuration, a resistance value R of the input resistor is set based on a capacitance value C of the parasitic capacitor and a target cutoff frequency fc of the filter such that $R=1/(2\pi \cdot fc \cdot C)$ (a second configuration).

Preferably, the operational amplifier having the first or second configuration further includes a power supply resistor which forms a filter together with a parasitic capacitor of a power supply line (a third configuration).

Preferably, a semiconductor device disclosed herein includes the operational amplifier having any one of the first to third configurations, a reference current setting portion configured to set a reference current of the operational amplifier, a power supply line laid between a power supply terminal and each of the operational amplifier and the reference current setting portion, a ground line laid between a ground terminal and each of the operational amplifier and the reference current setting portion, and a reference current setting line laid between the operational amplifier and the reference current setting portion (a fourth configuration).

Preferably, the semiconductor device having the fourth configuration further includes a capacitor connected between the power supply line and the reference current setting line (a fifth configuration).

Preferably, in the semiconductor device having the fifth configuration, the capacitor is a parasitic capacitor between the power supply line and the reference current setting line (a sixth configuration).

Preferably, in the semiconductor device having the sixth configuration, in plan view of the semiconductor device, the power supply line and the reference current setting line are laid one above another so as to partially overlap with each other (a seventh configuration).

Preferably, in the semiconductor device having the seventh configuration, in plan view of the semiconductor device, a part of the reference current setting line that overlaps with the power supply line is laid in a grid pattern (an eighth configuration).

Preferably, in plan view of the semiconductor device having the eighth configuration, in a region enclosed by the reference current setting line laid in the grid pattern, a transistor is formed which functions as a reference current source of the operational amplifier (a ninth configuration).

Preferably, in the semiconductor device having the ninth configuration, the transistor is composed of a plurality of unit transistors, and in plan view of the semiconductor device, the plurality of unit transistors are respectively formed in a plurality of regions enclosed by the reference current setting line laid in the grid pattern (a tenth configuration).

Preferably, in plan view of the semiconductor device having any one of the eighth to tenth configuration, a proportion of an area occupied by the power supply line in a region enclosed by the reference current setting line laid in the grid pattern is equal to or more than ½ (an eleventh configuration).

Preferably, in the semiconductor device having any one of the sixth to eleventh configurations, the reference current setting line is laid using a first wiring layer, the power supply line is laid using a second wiring layer, the capacitor is formed in a region where the power supply line and the reference current setting line overlap with each other, with the first wiring layer and the second wiring layer as electrodes, and with an insulating layer laid between the electrodes as a dielectric body (a twelfth configuration).

Preferably, the semiconductor device having any one of the fourth to twelfth configurations further includes a shield member inserted between the power supply line and each of another wiring and another element (a thirteenth configuration).

Preferably, in the semiconductor device having the thirteenth configuration, the shield member is the ground line (a fourteenth configuration).

Preferably, in the semiconductor device having any one of the fourth to fourteenth configurations, a width of the ground line and a width of the reference current setting line are each narrower than a width of the power supply line (a fifteenth configuration).

Preferably, in the semiconductor device having the fifteenth configuration, the width of the ground line and the width of the reference current setting line are each equal to or less than half the width of the power supply line (a sixteenth configuration).

Preferably, the semiconductor device having any one of the fourth to sixteenth configurations includes, integrated therein, a plurality of channels of the operational amplifier (a seventeenth configuration).

Preferably, in the semiconductor device having the seventeenth configuration, external terminals for a first channel are provided on a first side of a package, and external terminals for a second channel are provided on a second side of the package (an eighteenth configuration).

An electronic appliance disclosed herein includes the semiconductor device having any one of the fourth to eighteenth configurations (a nineteenth configuration).

A vehicle disclosed herein includes the electronic appliance having the nineteenth configuration (a twentieth configuration).

Advantageous Effects of the Invention

The invention disclosed herein makes it possible to provide an operational amplifier excellent in noise characteristics.

DESCRIPTION OF EMBODIMENTS

<Basic Concept>

Figure 1:
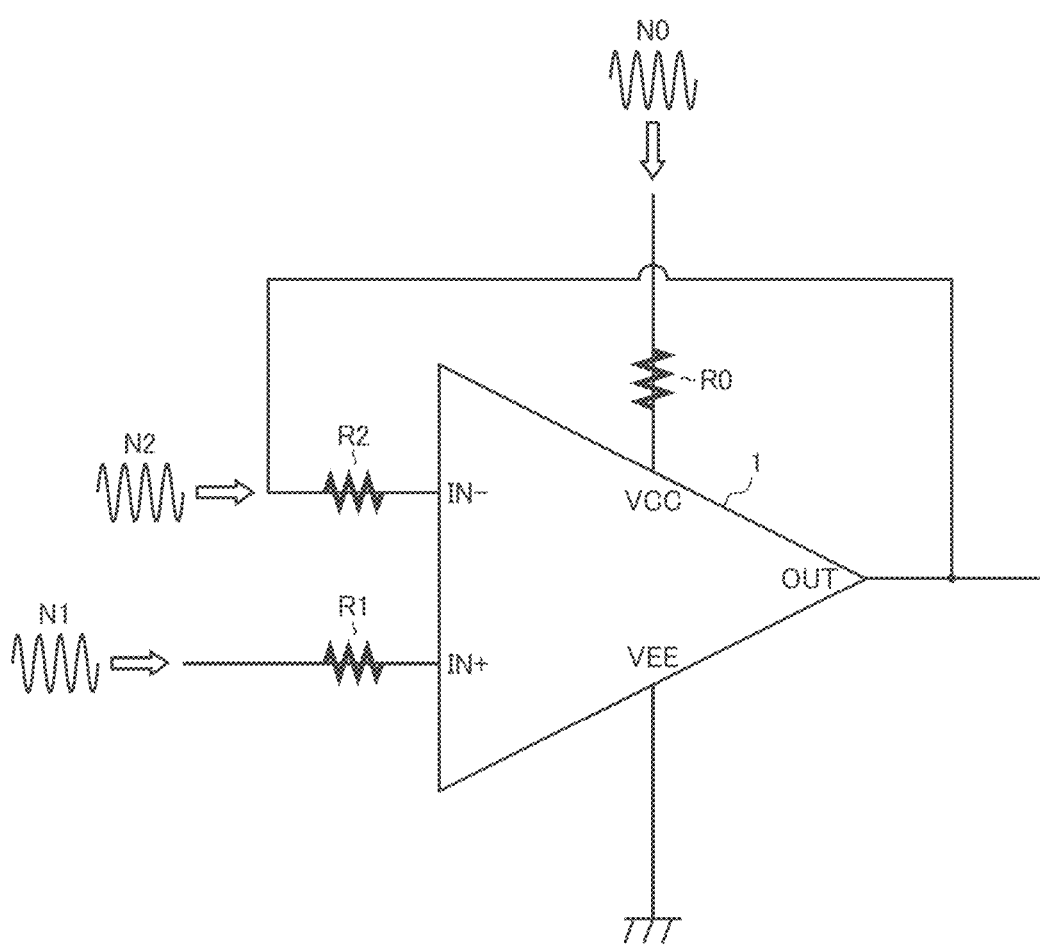
FIG. 1 is a diagram for illustrating a basic concept of improving noise characteristic by means of impedance adjustment.

FIG. 1 is a diagram for illustrating a basic concept of improving noise characteristics of an operational amplifier by means of impedance adjustment.

As shown in the figure, main examples of a noise signal externally fed to an operational amplifier 1 of the present configuration example include a noise signal N0 fed to the power supply terminal VCC, a noise signal N1 fed to the non-inverting input terminal IN+, and a noise signal N2 fed to the inverting input terminal IN− as a result of shaking of the output terminal OUT or interference from a noise input line.

To cope with these signals, the operational amplifier 1 of the present configuration example includes a resistor R0 (=corresponding to a power supply resistor) connected to the power supply terminal VCC, and resistors R1 and R2 (=corresponding to input resistors) which are respectively connected to the non-inverting input terminal IN+ and the inverting input terminal IN−. With such a configuration, the terminal impedance of each of the power supply terminal VCC, the non-inverting input terminal IN+, and the inverting input terminal IN− can be raised to suppress input of the noise signals N0 to N2.

Figure 2:
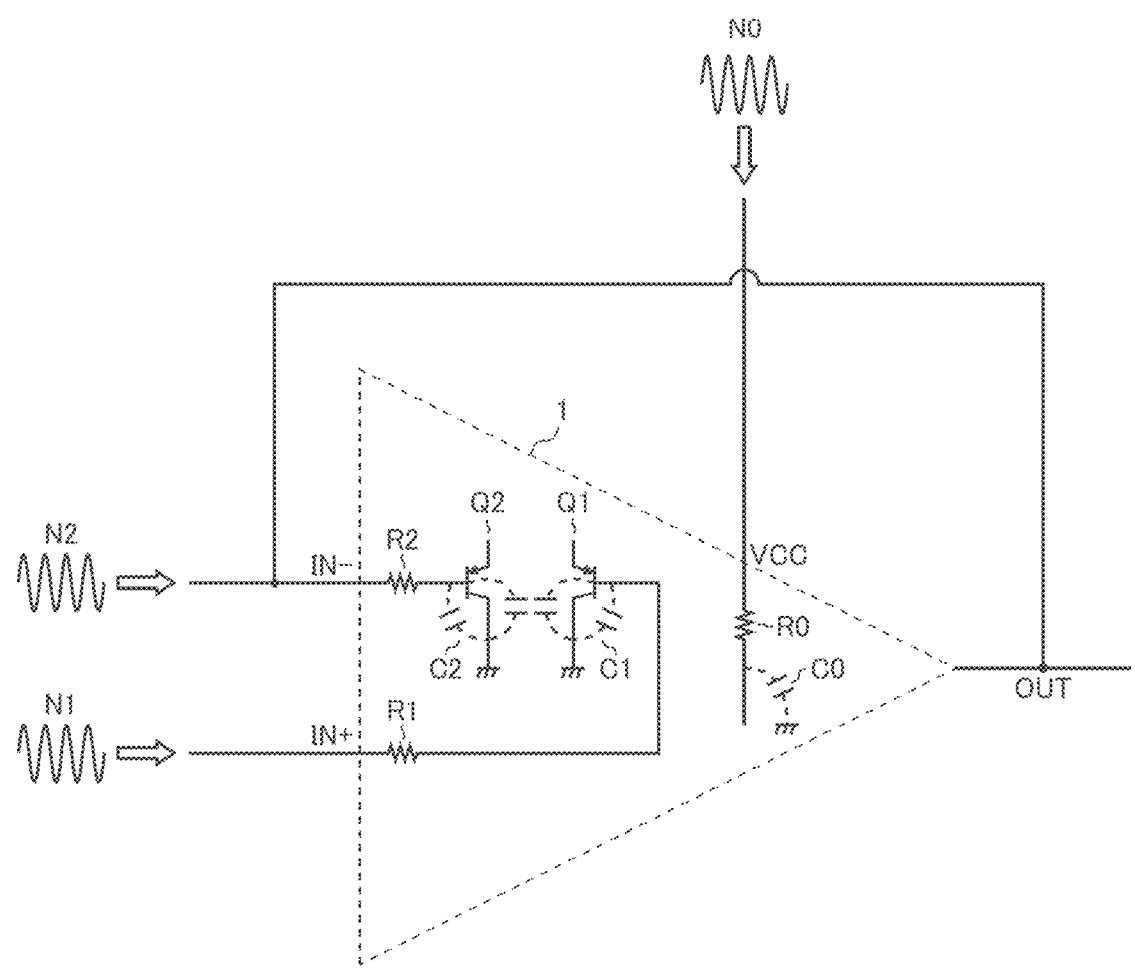
FIG. 2 is a diagram showing how a low-pass filter is formed inside an operational amplifier by using resistors.

FIG. 2 is a diagram showing how a low-pass filter (what is called an EMI (electromagnetic interference) filter) is formed inside the operational amplifier 1 by using the resistors R0 to R2.

As shown in the figure, the resistor R0 forms a low-pass filter together with a parasitic capacitor C0 of the power supply line of the operational amplifier 1. The resistors R1 and R2 respectively form low-pass filters together with parasitic capacitors C1 and C2 of pnp bipolar transistors Q1 and Q2, respectively, which forms the input stage of the operational amplifier 1.

Thus, in the operational amplifier 1 of the present configuration example, the parasitic capacitors of various components of the operational amplifier 1 are used as constituent elements of the low-pass filters. With such a configuration, there is no need of separately adding a capacitor to form a low-pass filter, and this helps prevent inviting problems such as deterioration of phase margin and increase of circuit area in the operational amplifier 1.

Here, the resistance value R of each of the resistors R1 and R2 can be set based on formula (1) below, using the capacitance value C of the parasitic capacitors C1 and C2, respectively, and the target cutoff frequency fc of a corresponding one of the low-pass filters.

$$R=1/(2\pi \cdot fc \cdot C) \quad (1)$$

For example, in a case where C=8.5 pF and fc=20 MHz, the resistance value R can be set such that R≈900Ω.

Here, basically, the resistance value of the resistor R0 can also be set based on formula (1) above. However, since the resistor R0 is inserted in the power supply line of the operational amplifier 1, in setting its resistance value, full attention should be paid to preventing the power supply voltage of the operational amplifier 1 from falling below the lower-limit driving voltage of the operational amplifier 1. In a case where only a minimal resistor can be used as the resistor R0, along with the parasitic capacitor C0, a minimum number of capacitors necessary may be separately added.

Semiconductor Device (First Embodiment)

Figure 3:
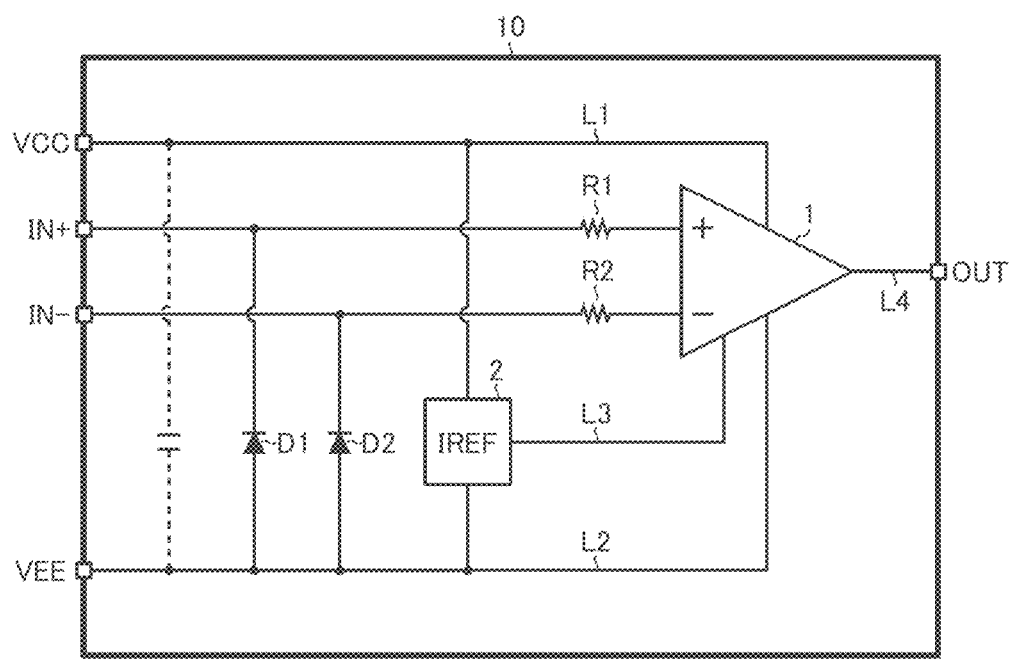
FIG. 3 is a diagram showing a first embodiment of a semiconductor device.

FIG. 3 is a block diagram showing a first embodiment of a semiconductor device. A semiconductor device 10 of the present embodiment is what is called an operational amplifier IC, which is a monolithic semiconductor integrated circuit device, and includes, integrated therein, an operational amplifier 1, a reference current setting portion 2, a power supply line L1, a ground line L2, a reference current setting line L3, an output line L4, and electrostatic protection diodes D1 and D2.

The semiconductor device 10 further includes, as means for establishing electrical connection with outside the device, a plurality of external terminals (a power supply terminal VCC, a non-inverting input terminal IN+, an inverting input terminal IN−, a ground terminal VEE, and an output terminal OUT).

As described previously, the operational amplifier 1 includes resistors R1 and R2 which form low-pass filters together with unillustrated parasitic capacitors C1 and C2 (see FIG. 2). More specifically, the non-inverting input node (+) of the operational amplifier 1 is connected, via the resistor R1, to the non-inverting input terminal IN+ of the semiconductor device 10. The inverting input node (−) of the operational amplifier 1 is connected, via the resistor R2, to the inverting input terminal IN− of the semiconductor device 10. Here, the present figure illustrates an example where an operational amplifier 1 having one channel is integrated in the semiconductor device 10, but an operational amplifier 1 having a plurality of channels may instead be integrated in the semiconductor device 10.

The reference current setting portion 2 sets a reference current Iref, which flows inside the operational amplifier 1. The circuit configuration of the reference current setting portion 2 will be described later.

The power supply line L1 is laid between the power supply terminal VCC of the semiconductor device 10 and the power supply node of each of the operational amplifier 1 and the reference current setting portion 2. The ground line L2 is laid between the ground terminal VEE of the semiconductor device 10 and the ground node of each of the operational amplifier 1 and the reference current setting portion 2. The reference current setting line L3 is laid between the reference current setting node of the operational amplifier 1 and the output node of the reference current setting portion 2. The output line L4 is laid between the output node of the operational amplifier 1 and the output terminal OUT of the semiconductor device 10.

The cathode of the electrostatic protection diode D1 is connected to the non-inverting input terminal IN+ of the semiconductor device 10. The cathode of the electrostatic protection diode D2 is connected to the inverting input terminal IN− of the semiconductor device 10. The anodes of the electrostatic protection diodes D1 and D2 are both connected to the ground terminal VEE of the semiconductor device 10. With this configuration having the electrostatic protection diodes D1 and D2, a high surge resistance can be achieved.

Now, many common semiconductor devices have a bypass capacitor (for example, 100 pF) inserted between the power supply terminal and the ground terminal to regulate the power supply voltage. However, the inventors of the present invention have found, through earnest studies, that if a bypass capacitor is inserted between the power supply terminal VCC and the ground terminal VEE of a semiconductor device 10, the input impedance of the power supply terminal VCC with respect to high frequency signals decreases, so that it becomes more likely for noise signals (high frequency signals) to reach the power supply node of an operational amplifier 1, to degrade the noise characteristics of the operational amplifier 1.

Thus, in the semiconductor device 10 of the present embodiment, as indicated by a short-dash line in the present figure, no bypass capacitor is connected between the power supply terminal VCC and the ground terminal VEE, and furthermore, the parasitic capacitor between the power supply line L1 and the ground line L2 is minimized (for example, 20 pF or lower). With such a configuration, the input impedance of the power supply terminal VCC with respect to high frequency signals increases, so that it becomes less likely for noise signals to reach the power supply node of the operational amplifier, and this helps improve the noise characteristics of the operational amplifier 1.

Figure 4:
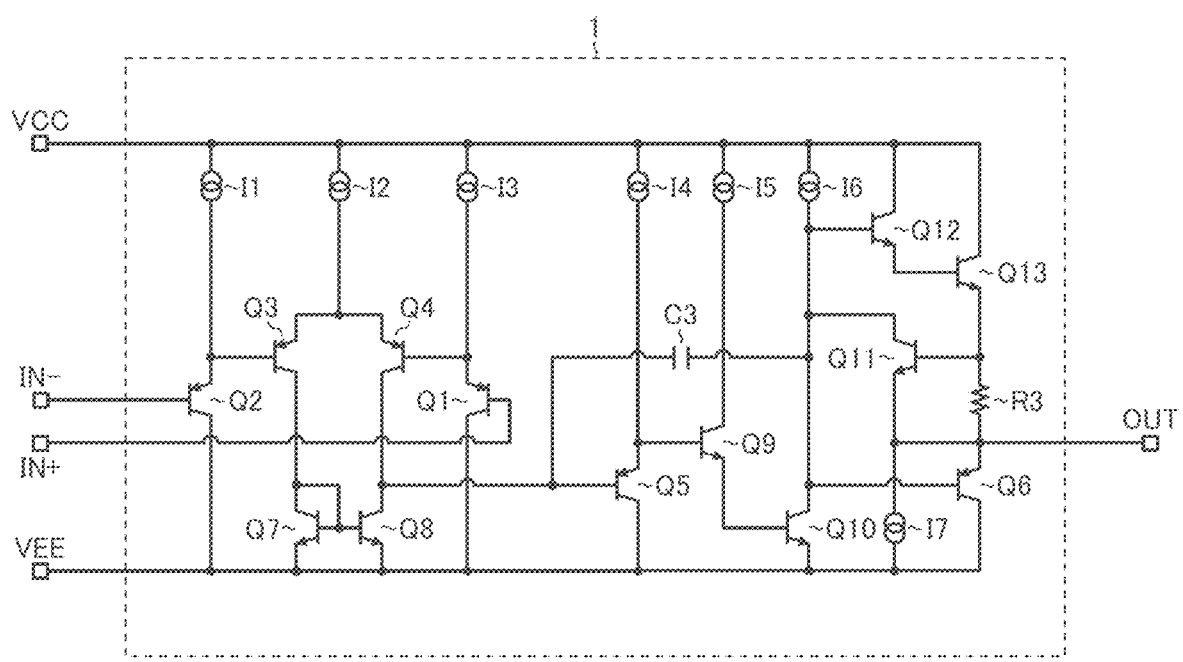
FIG. 4 is a diagram showing a configuration example of an operational amplifier.

FIG. 4 is a diagram showing a configuration example of the operational amplifier 1. The operational amplifier 1 of the present configuration example includes, in addition to the above-mentioned pnp bipolar transistors Q1 and Q2, pnp bipolar transistors Q3 to Q6, npn bipolar transistors Q7 to Q13, a resistor R3, a capacitor C3, and current sources I1 to I7. The current sources I1 to I7 each pass the reference current Iref (or a constant current corresponding to it) set by the reference current setting portion 2.

First terminals of the current sources I1 to I3 are connected to the power supply terminal VCC. A second terminal of the current source I1 is connected to the emitter of the transistor Q2 and the base of the transistor Q3. A second terminal of the current source I2 is connected to the emitters of the transistors Q3 and Q4. A second terminal of the current source I3 is connected to the emitter of the transistor Q1 and the base of the transistor Q4.

The base of the transistor Q1 is connected to the non-inverting input terminal IN+ via the resistor R1 (see FIG. 2 or FIG. 3), which is not shown in the present figure. The base of the transistor Q2 is connected to the inverting input terminal IN−via the resistor R2 (see FIG. 2 or FIG. 3), which is not shown in the present figure. The collectors of the transistors Q1 and Q2 are both connected to the ground terminal VEE.

The collector of the transistor Q3 is connected to the collector of the transistor Q7. The collector of the transistor Q4 is connected to the collector of the transistor Q8. The bases of the transistors Q7 and Q8 are both connected to the collector of the transistor Q7. The emitters of the transistors Q7 and Q8 are both connected to the ground terminal VEE.

The thus connected current sources I1 to I3, the transistors Q1 to Q4, and the transistors Q7 and Q8 form the input stage, or the amplification stage, of the operational amplifier 1.

First terminals of the current sources I4 and I5 are both connected to the power supply terminal VCC. A second terminal of the current source I4 is connected to the emitter of the transistor Q5 and the base of the transistor Q9. A second terminal of the current source I5 is connected to the collector of the transistor Q9.

The base of the transistor Q5 is connected to the collector of the transistor Q8 and a first terminal of the capacitor C3. A second terminal of the capacitor C3 is connected to the collector of the transistor Q10. The emitter of the transistor Q9 is connected to the base of the transistor Q10. The collector of the transistor Q5 and the emitter of the transistor Q10 are both connected to the ground terminal VEE.

A first terminal of the current source I6 and the collectors of the transistor Q12 and Q13 are all connected to the power supply terminal VCC. A second terminal of the current source I6 is connected to the collectors of the transistor Q10 and Q11 and the base of the transistor Q12. The emitter of the transistor Q12 is connected to the base of the transistor Q13. The emitter of the transistor Q13 is connected to the base of the transistor Q11 and a first terminal of the resistor R3.

The emitters of the transistor Q6 and Q11, a second terminal of the resistor R3, and a first terminal of the current source I7 are all connected to the output terminal OUT. The base of the transistor Q6 is connected to the collector of the transistor Q10. A second terminal of the current source I7 and the collector of the transistor Q6 are both connected to the ground terminal VEE.

The thus connected current sources I4 to I7, the transistors Q5 and Q6, the transistors Q9 to Q13, the capacitor C3, and the resistor R3 form the output stage of the operational amplifier 1.

It should be noted that the circuit configuration shown in the present figure is merely an example, and any circuit configuration may be adopted as long as it can achieve a desired operation as the operational amplifier 1.

Semiconductor Device (Second Embodiment)

Figure 5:
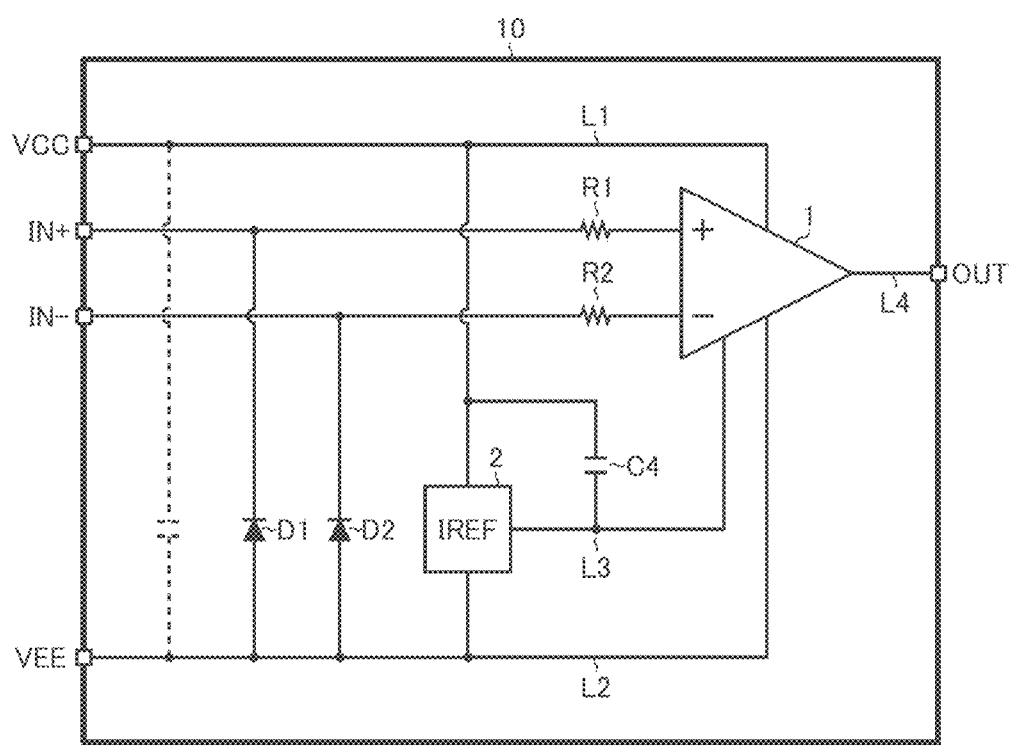
FIG. 5 is a diagram showing a second embodiment of a semiconductor device.

FIG. 5 is a diagram showing a second embodiment of the semiconductor device 10. The semiconductor device 10 of the present embodiment is based on the first embodiment (FIG. 3) discussed above, but is different from the first embodiment in that a capacitor C4 is further included which is connected between the power supply line L1 and the reference current setting line L3.

With such a configuration, the power supply line L1 and the reference current setting line L3 can be made to fluctuate in the same behavior when noise is fed to the power supply terminal VCC, and thus the base-emitter voltage of a transistor Q14 is maintained constant. As a result, the reference current Iref (not shown) flowing inside the operational amplifier 1 becomes unlikely to be affected by noise, and thus the noise characteristics of the operational amplifier 1 can be improved.

Figure 6:
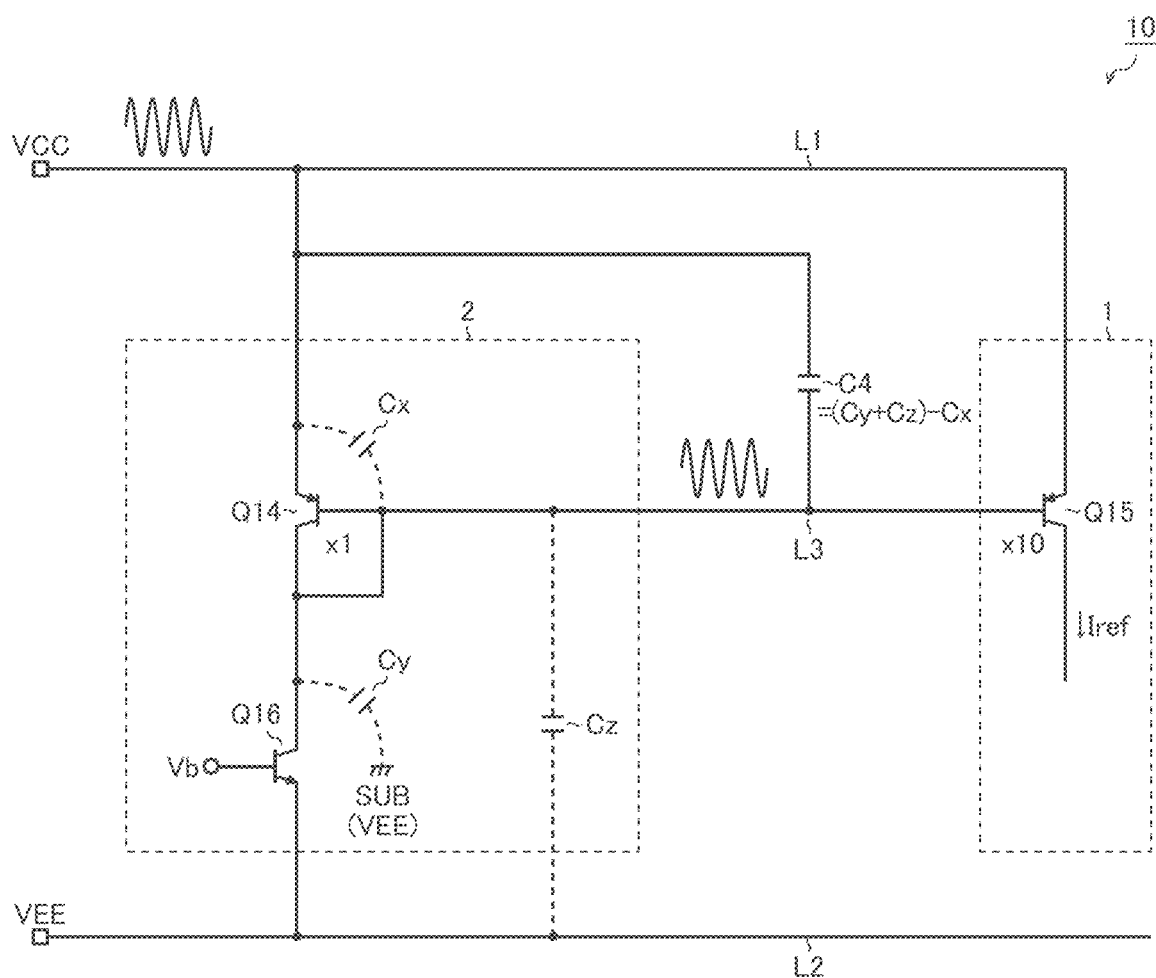
FIG. 6 is a diagram showing a configuration example of a reference current setting portion.

FIG. 6 is a diagram showing a configuration example of the reference current setting portion 2. As shown in the present figure, the reference current setting portion 2 of the present configuration example includes the pnp bipolar transistor Q14 and an npn bipolar transistor Q16. The operational amplifier 1 further includes a pnp bipolar transistor Q15.

The emitters of the transistors Q14 and Q15 are both connected to the power supply terminal VCC. The bases of the transistor Q14 and Q15 are both connected to the collector of the transistor Q14. Thus, the transistor Q14 and Q15 function as a current mirror that generates a collector current of the transistor Q15 by copying a collector current of the transistor Q14 at a predetermined mirror ratio (for example, 10 times).

Here, the collector current of the transistor Q15 is made to flow to the aforementioned current sources I1 to I7 (see FIG. 4) as the reference current Iref of the operational amplifier 1. That is, the transistor Q15, which is illustrated in the present figure as if it were a single element, is actually composed of a plurality of unit transistors, and current mirrors each formed by using one of the unit transistors function as the current sources I1 to I7.

The collector of the transistor Q14 is connected to the collector of the transistor Q16. The emitter of the transistor Q16 is connected to the ground terminal VEE. To the base of the transistor Q16, a predetermined bias voltage Vb is applied.

Further, as has been described previously, the capacitor C4 is connected between the power supply line L1 and the reference current setting line L3. Accordingly, even if noise is fed to the power supply terminal VCC, the power supply line L1 and the reference current setting line L3 can be made to fluctuate in a similar manner, and this makes it possible to maintain the base-emitter voltage of the transistor Q14 at a constant value.

Figure 7:
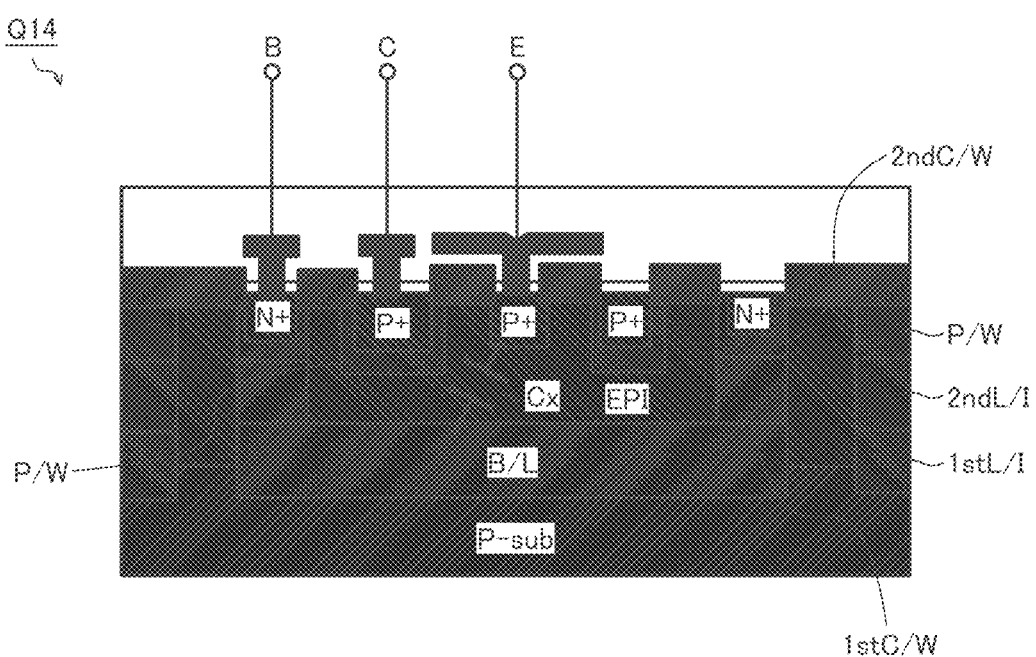
FIG. 7 is a vertical sectional view of a pnp bipolar transistor.

However, as shown in FIG. 7, the transistor Q14 has a parasitic capacitor Cx between its emitter (=a high-concentration p-type semiconductor region P+) and its base (=n-type buried layer B/L, which is a high-concentration n-type semiconductor region N+, and an epitaxial growth layer EPI, which is a low-concentration n-type semiconductor region N−). This applies also to the transistor Q15.

Figure 8:
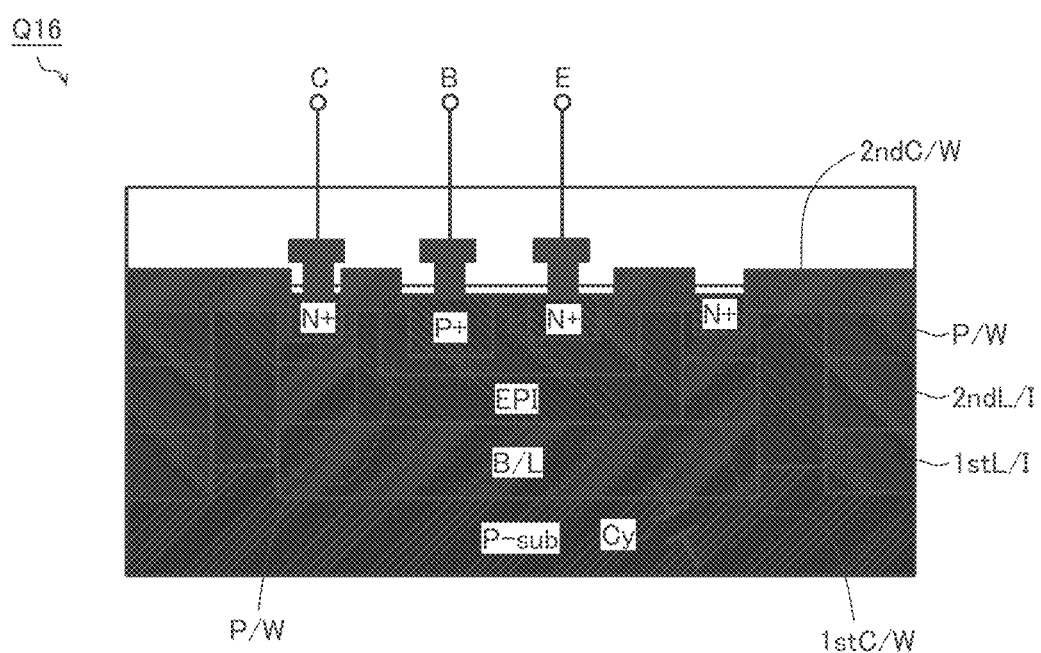
FIG. 8 is a vertical sectional view of an npn bipolar transistor.

Further, as shown in FIG. 8, the transistor Q16 has a parasitic capacitor Cy between its collector (=an n-type buried layer B/L, which is a high-concentration n-type semiconductor region N+, and an epitaxial growth layer EPI, which is a low-concentration n-type semiconductor region N−) and its p-type semiconductor substrate (=P-sub).

Furthermore, a parasitic capacitor Cz is formed between the reference current setting line L3 and the ground line L2.

In view of the presence of the above-described parasitic capacitors Cx to Cz, it is preferable to set the capacitance value of the capacitor C4 based on formula (2) below.

$$C4=(Cy+Cz)-Cx \qquad (2)$$

For example, in a case such that Cx=550 fF, Cy=700 fF, and Cz=50 fF, the capacitance value of the capacitor C4 can be set such that C4=200 fF.

By performing such capacitance adjustment, the line-to-line capacitance value between the power supply line L1 and the reference current setting line L3 can be made equal to that between the reference current setting line L3 and the ground line L2, and thus the most can be made of the previously mentioned effect of making the power supply line L1 and the reference current setting line L3 fluctuate in a similar manner when noise is fed to the power supply terminal VCC.

<Wiring Layout>

Figure 9:
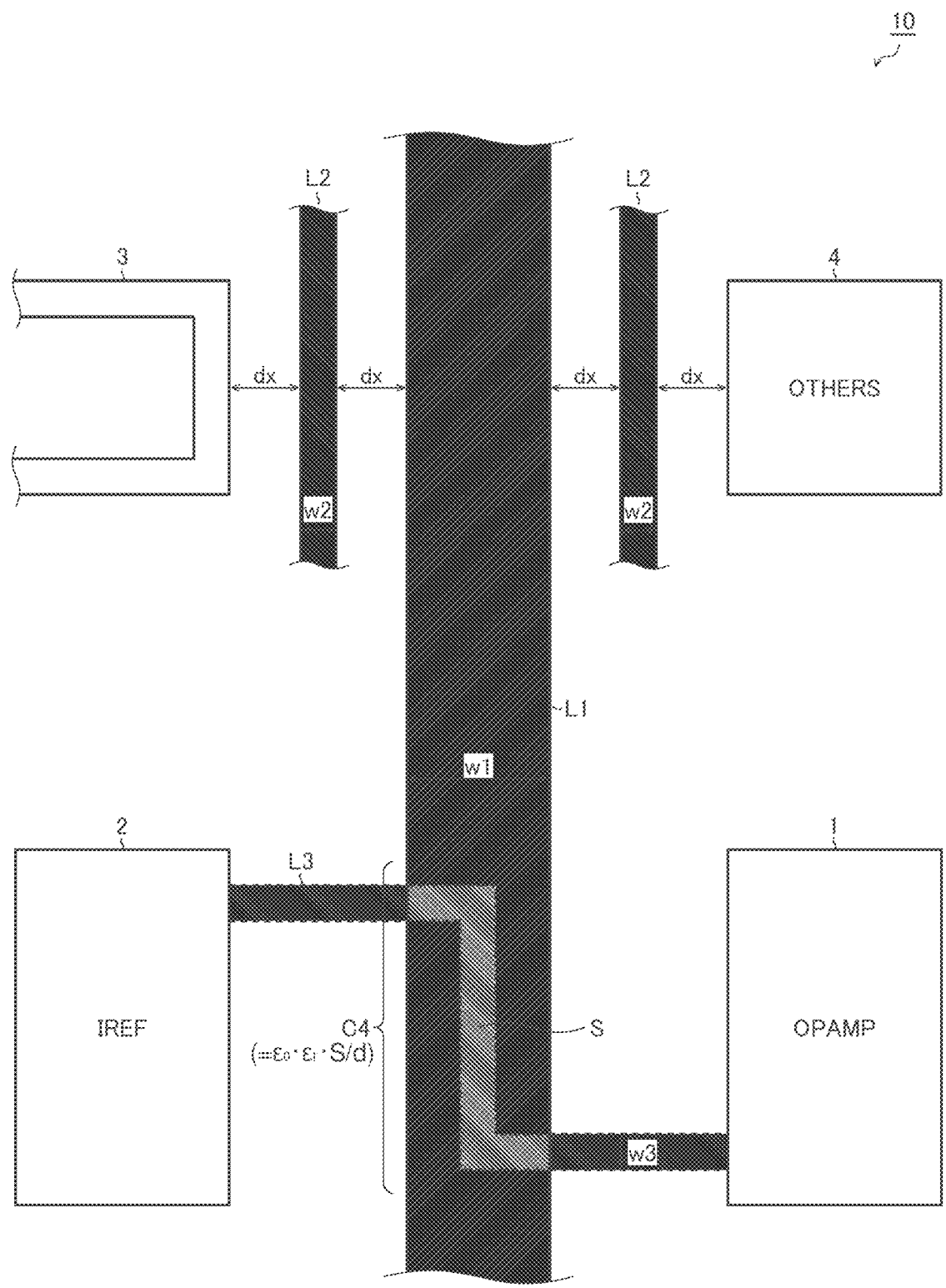
FIG. 9 is a diagram showing an example of a wiring layout.

FIG. 9 is a plan view schematically showing an example of a wiring layout in the semiconductor device 10 of the second embodiment. Here, in the present figure, the power supply line L1 (width w1) and the ground line L2 (width w2), which are laid in a second wiring layer, are illustrated with solid lines, and the reference current setting line L3 (width w3) laid in a first wiring layer (which is directly under the second wiring layer) is illustrated with short-dash lines in a see-through manner. As to the widths w1 to w3, it is preferable to design such that the width w3 of the reference current setting line L3 is equal to or less than half the width w1 of the power supply line L1; for example, the widths can be set such that w1=20 μm, w2=5 μm, and w3=5 μm.

In the wiring layout shown in the present figure, the power supply line L1 and the reference current setting line L3 are laid one above the other so as to partially overlap with each other in plan view of the semiconductor device 10. More specifically, the reference current setting line L3 is not laid along the shortest route (which is, in the present figure, the route orthogonal to the power supply line L1) between the operational amplifier 1 and the reference current setting portion 2, but is laid along a bypass route part of which is parallel to the power supply line L1. Further, by laying the reference current setting line L3 and the power supply line L1 such that their centers overlap with each other, generation of noise can be further reduced.

The adoption of such a wiring layout makes it possible to use, as the aforementioned capacitor C4, the parasitic capacitor formed between the power supply line L1 and the reference current setting line L3.

The capacitance value of the capacitor C4 is calculated from the dielectric constant in vacuum $\epsilon 0$ (=8.85×10$^{-12}$), the relative dielectric constant of the interlayer insulation film (such as a SiN film) separating the power supply line L1 from the reference current setting line L3, and the overlapping area S over which the power supply line L1 and the reference current setting line L3 overlap with each other, based on formula (3) below.

$$C4 = \varepsilon 0 \times \varepsilon r \times S/d \quad (3)$$

Accordingly, for example, in the semiconductor device 10 where εr=6.0 and d=10000 Å, in a case where adjustment such that C4≈200 fF is desired, the adjustment can be achieved by laying the power supply line L1 and the reference current setting line L3 such that S=3800 µm².

Further, it is desirable to lay the power supply line L1 as far away as possible from a wiring 3 and an element 4, which are not connected to the power supply line L1. The power supply node of the operational amplifier 1 is preferably disposed at a positions as far away as possible from the other nodes (=such as the input node and the output node).

Furthermore, it is desirable to lay a shield member (in the present figure, the ground line L2) between the power supply line L1 and each of the wiring 3 and the element 4 to prevent mutual electromagnetic interference. In doing so, it is desirable to design such that a line-to-line distance dx between the power supply line L1 and the ground line L2 has a sufficiently large value (for example, 10 µm). In other words, the line-to-line distance dx is preferably larger than the width w2 of the ground line L2. Furthermore, it is preferable to arrange the ground line L2 at the center between the wiring 3 and the power supply line L1, but the ground line L2 may be arranged closer to the wiring 3.

With such a wiring layout, mainly a parasitic capacitor (=the capacitor C4) formed between the lines L1 and L3 and a parasitic capacitor formed between the lines L1 and L2 function as the parasitic capacitor of the power supply line L1. Accordingly, the electromagnetic interference from the power supply line L1 to the wiring 3 and the element 4 is reduced, and this helps improve the noise characteristics of the operational amplifier 1.

<Noise Characteristics Evaluation>

Figure 10:
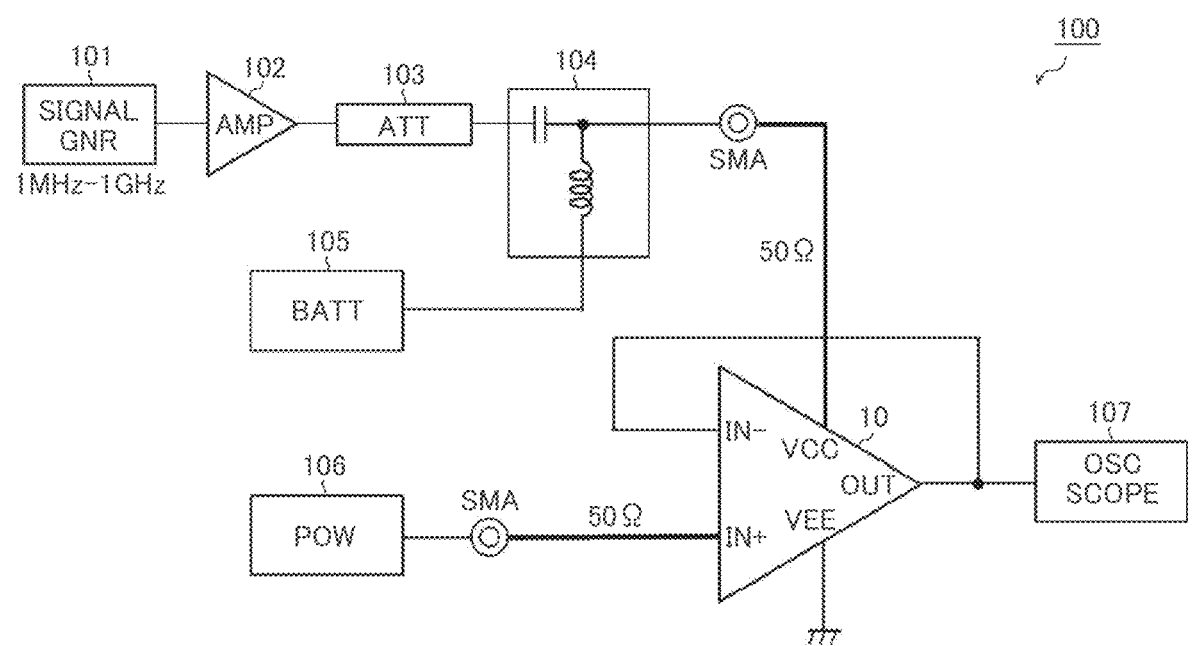
FIG. 10 is a diagram showing a measurement circuit used in a DPI test.
Figure 11:
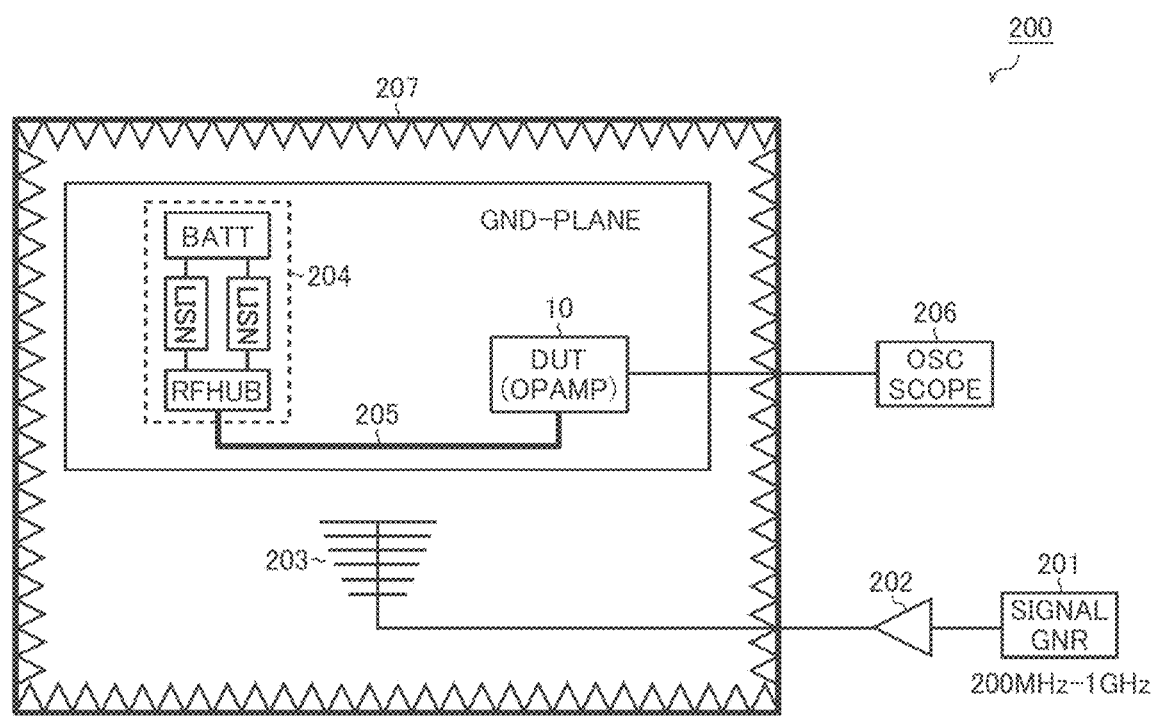
FIG. 11 is a diagram showing a measurement circuit used in a radio emission test.

FIG. 10 and FIG. 11 are diagrams showing measurement circuits for a DPI (direct power injection) test and a radio emission test, respectively, conducted with the semiconductor device 10 as the DUT (device under test).

As shown in FIG. 10, a measurement circuit 100 for the DPI test includes, in addition to the semiconductor device 10 as the DUT, a signal generator 101, an amplifier 102, an attenuator 103, a bias tee 104, a battery 105 (for example, Vcc=12 V), a direct current power supply 106 (for example, Vin=6 V), and an oscilloscope 107.

The power supply terminal VCC of the semiconductor device 10 is connected to the output node of the bias tee 104 via a coaxial cable (impedance: 50Ω) having an SMA (sub miniature type A) connector. The non-inverting input terminal IN+ of the semiconductor device 10 is connected to the output node of the direct current power supply 106 via a coaxial cable (impedance: 50Ω) having an SMA connector. The inverting input terminal IN– and the output terminal OUT of the semiconductor device 10 are short-circuited.

In the DPI test using the measurement circuit 100, a noise signal having a predetermined strength (for example, 17 dBM) is directly injected into the power supply terminal VCC of the semiconductor device 10. At that time, by sequentially reading the output voltage appearing at the output terminal OUT of the semiconductor device 10 while sweeping the frequency of the noise signal in a predetermined range (for example, 1 MHz to 1 GHz), a plot of frequency vs output voltage can be obtained.

As shown in FIG. 11, a measurement circuit 200 for the radio emission test includes, in addition to the semiconductor device 10 as the DUT, a signal generator 201, an amplifier 202, an antenna 203, a pseudo-power supply 204 (for example, Vcc=12 V), a wire harness 205, and an oscilloscope 206. Among these, the antenna 203, the pseudo-power supply 204, the wire harness 250, and the semiconductor device 10 as the DUT are all arranged in an anechoic chamber 207.

In the radio emission test using the measurement circuit 200, a noise signal having a predetermined electric-field strength (for example, 200 V/m) is radiated from the antenna 203 toward the noise injection point of the wire harness 205. Here, the total length of the wire harness 205 is 150 cm, and the distance from the noise injection point to the semiconductor device 10 is 75 cm. The distance from the antenna 203 to the noise injection point is 100 cm. These dimensions are based on ISO 11452-2.

In the above measurement circuit 200, with the wire harness 205 connected to the power supply terminal VCC of the semiconductor device 10, the noise signal is indirectly injected into the power supply terminal VCC of the semiconductor device 10. At that time, by sequentially reading the output voltage appearing at the output terminal OUT of the semiconductor device 10 while sweeping the frequency of the noise signal in a predetermined range (for example, 200 MHz to 1 GHz), a plot of frequency vs output voltage can be obtained.

Figure 12:
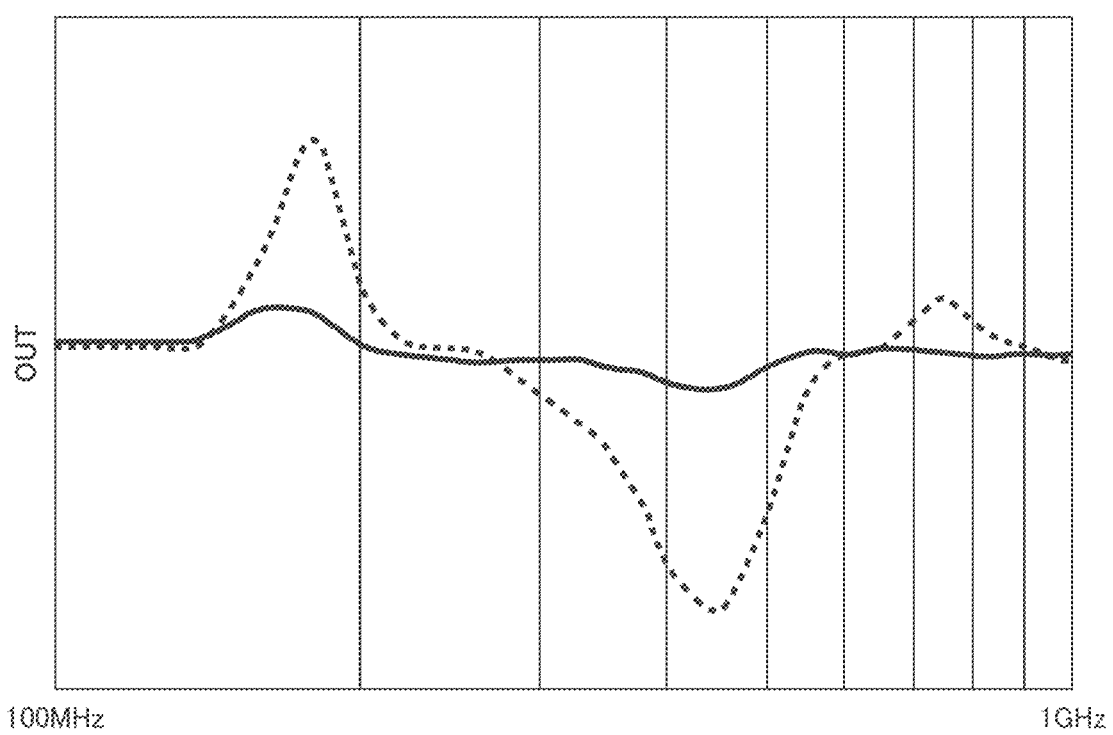
FIG. 12 is a diagram showing an example of a DPI test result.
Figure 13:
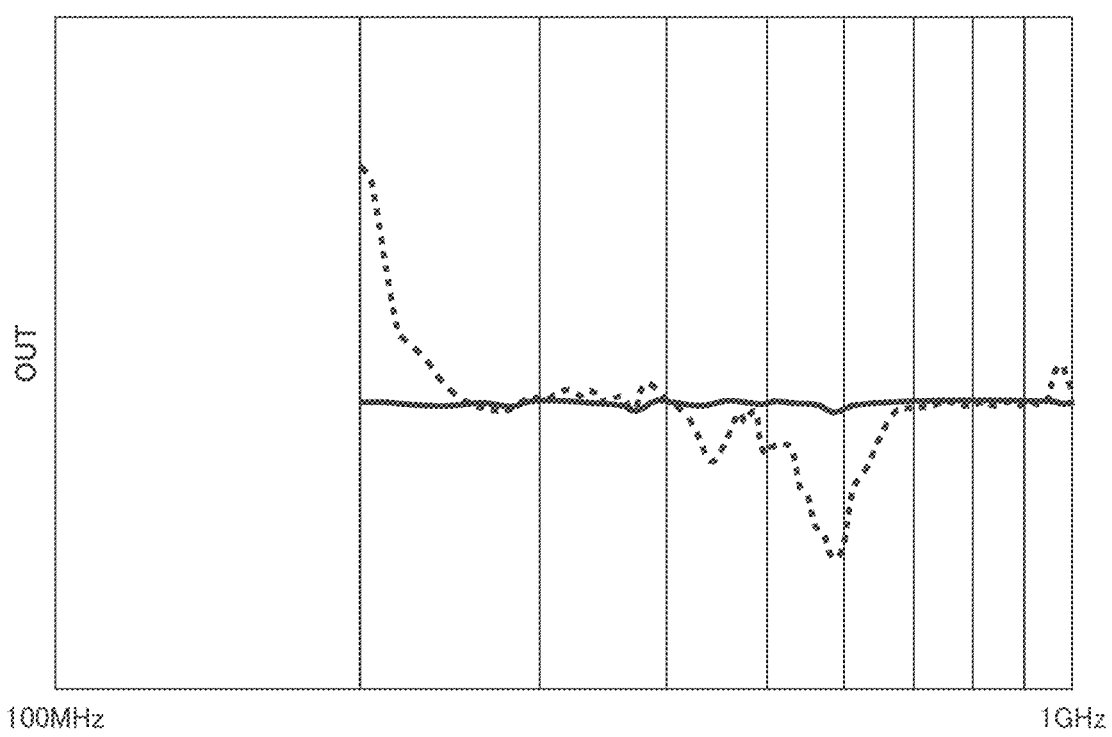
FIG. 13 is a diagram showing an example of a radio emission test result.

FIG. 12 and FIG. 13 are diagrams respectively showing examples of results of the DPI test and the radio emission test. In each of the figures, the horizontal axis (the logarithmic axis) represents the frequency of the noise signal, and the vertical axis represents the output voltage of the semiconductor device 10.

The solid line in each of the figures indicates the result of a test performed with the semiconductor device 10 of the second embodiment (FIG. 5) as the DUT. On the other hand, the short-dash line in each of the figures indicates the result of a test performed with a conventional operation amplifier (=without the resistors R1 and R2, without the capacitor C4, with a bypass capacitor) as the DUT.

The test condition in FIG. 12 is as follows; the noise application level: 17 dBm, the frequency: 100 MHz to 1 GHz. The test condition in FIG. 13 is as follows; the measurement circuit: a voltage follower, Vcc: 12 V, Vin: 6 V, the temperature: room temperature, the test method: substitution method (traveling-wave power), electric-field strength: 200 V/m, the test wave: CW (continuous wave), frequency: 200 MHz to 1 GHz (2% step).

As is clear from each of these figures, with the semiconductor device 10 of the second embodiment (FIG. 5), in whichever test, no peak exceeding ±5% appears over the entire frequency-sweeping range. Thus, the semiconductor device 10 of the second embodiment (FIG. 5) has excellent noise characteristics, and its output varies very little even when a noise is fed thereto. This contributes to providing simple measures against noise in a set in which the semiconductor device 10 is mounted, making the set very handy.

Semiconductor Device (Third Embodiment)

Figure 14:
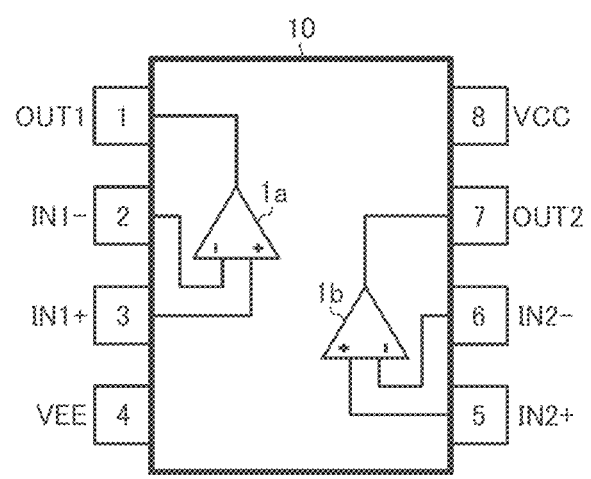
FIG. 14 is a terminal arrangement diagram showing a third embodiment of a semiconductor device.

FIG. 14 is a terminal arrangement diagram showing a third embodiment of a semiconductor device. A semiconductor device 10 of the present embodiment has two channels of operational amplifiers 1a and 1b (=each corresponding to the operational amplifier 1 discussed previously)

integrated therein. Here, for convenience of illustration, components other than the operational amplifiers 1a and 1b are not shown.

Further, as the package of the semiconductor device 10, there may be adopted an SOP (Small Outline Package), an SSOP (Shrink SOP), or, an MSOP (Micro SOP), each having four terminals derived from each of two opposite sides thereof, thus a total of eight external terminals (pin-1 to pin-8) derived therefrom. In the present figure, pin-1 to pin-4 are provided on a first side of the package, and pin-5 to pin-8 are provided on a second side of the package.

Pin-1 is the output terminal OUT1 of a first channel, and is connected to the output terminal of the operational amplifier 1a. Pin-2 is the inverting input terminal IN1− of the first channel, and is connected to the inverting input terminal (−) of the operational amplifier 1a. Pin-3 is the non-inverting input terminal IN1+ of the first channel, and is connected to the non-inverting input terminal (+) of the operational amplifier 1a. Pin-4 is the ground terminal VEE.

Pin-5 is the non-inverting input terminal IN2+ of the second channel, and is connected to the non-inverting input terminal (+) of the operational amplifier 1b. Pin-6 is the inverting input terminal IN2− of the second channel, and is connected to the inverting input terminal (−) of the operational amplifier 1b. Pin-7 is the output terminal OUT2 of the second channel, and is connected to the output terminal of the operational amplifier 1b. Pin-8 is the power supply terminal VCC.

Thus, the external terminals (pin-1 to pin-3) of the first channel are all provided on the first side of the package, and the external terminals (pin-5 to pin-7) of the second channel are all provided on the second side of the package.

Here, although the present figure deals with an example where the two channels of operational amplifiers 1a and 1b are integrated, but it is also possible to integrate four-channel operational amplifiers. In that case, for example, an SOP, an SOP or an MSOP, each having 14 pins, can be preferably used.

Figure 15:
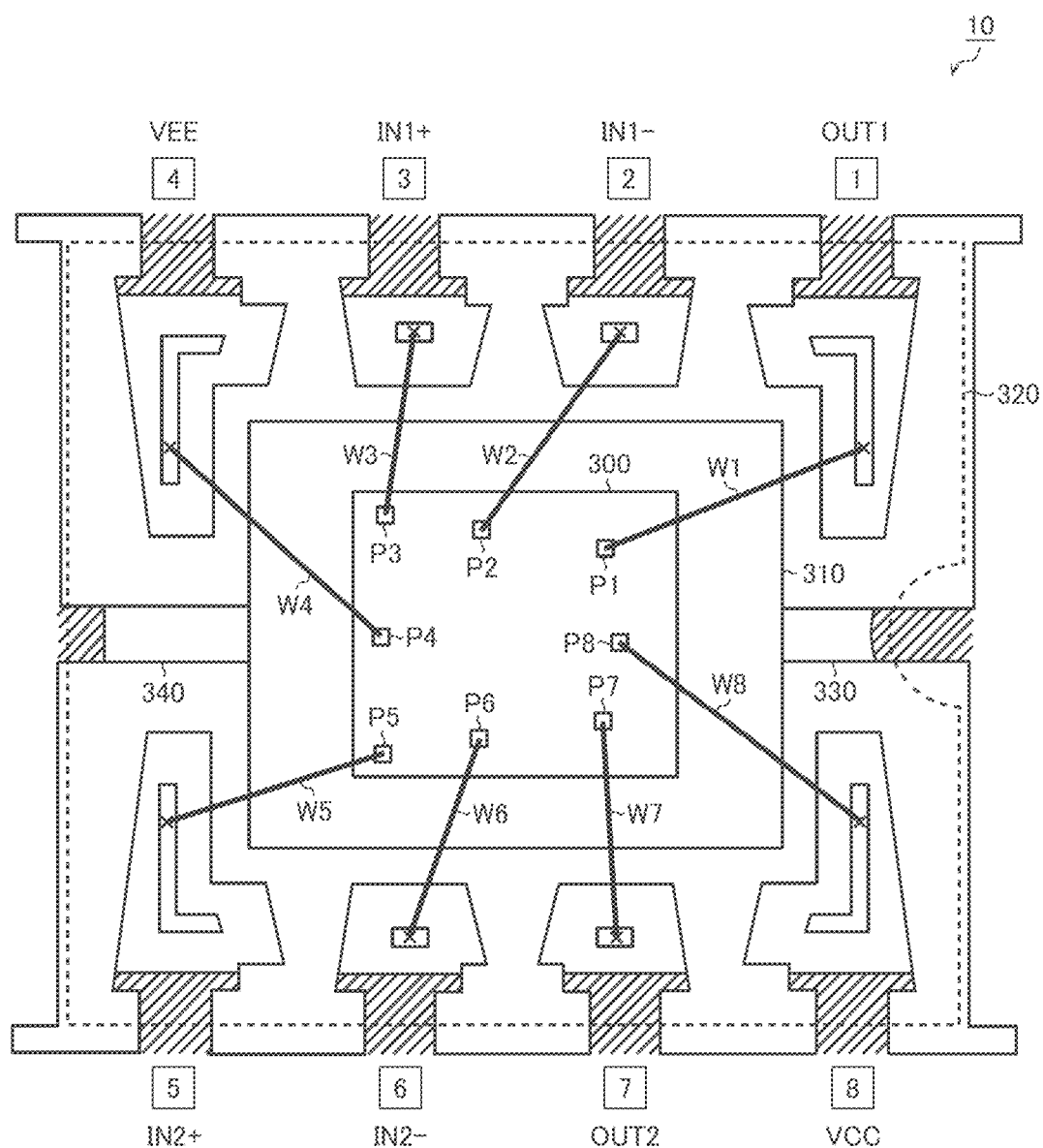
FIG. 15 is a bonding diagram showing a semiconductor device.

FIG. 15 is a bonding diagram showing bonding inside the package of the semiconductor device 10. In the semiconductor device 10, the operational amplifiers 1a and 1b, etc. are integrated in a semiconductor chip 300, which is mounted on an island 310 and sealed in that state with a mold resin 320. In the following description, the upward, downward, leftward, and rightward directions in the sheet on which the figure is drawn are defined as the upward, downward, leftward, and rightward directions in plan view of the semiconductor device 10 (or the semiconductor chip 300).

The semiconductor chip 300 has eight pads P1 to P8. The pad P1 is a pad corresponding to the output terminal of the operational amplifier 1a, and is connected to a leading end side of pin-1 (OUT1) via a wire W1. The pad P2 is a pad corresponding to the inverting input terminal (|) of the operational amplifier 1a, and is connected to pin-2 (IN1−) via a wire W2. The pad P3 is a pad corresponding to the inverting input terminal (+) of the operational amplifier 1a, and is connected to pin-3 (IN1+) via a wire W3. The pad P4 is a ground pad, and is connected to a leading end side of pin-4 (VEE) via a wire W4.

The pad P5 is a pad corresponding to the non-inverting input terminal (+) of the operational amplifier 1b, and is connected to pin-5 (IN2+) via a wire W5. The pad P6 is a pad corresponding to the inverting input terminal (−) of the operational amplifier 1b, and is connected to pin-6 (IN2−) via a wire W6. The pad P7 is a pad corresponding to the output terminal of the operational amplifier 1b, and is connected to a leading end side of pin-7 (OUT2) via a wire W7. The pad P8 is a power supply pad, and is connected to a leading end side of pin-8 (VCC) via a wire W8.

The pads P1 to P8 are arranged along the outer edge of the semiconductor chip 300 in order corresponding to the order in which pin-1 to pin-8 are arranged. Accordingly, the wires W1 to W8 each connecting a pad and a pin corresponding to the pad can each be laid at the shortest distance.

In terms of the frame area inside the package, pin-1 (OUT1), pin-4 (VEE), pin-5 (IN2+), and pin-8 (VCC) are all larger than any of pin-2 (IN−), pin-3 (IN1+), pin-6 (IN2−), and pin-7 (OUT2).

That is, in terms of the upward and downward directions in the sheet on which the figure is drawn, pin-1 (OUT1) and pin-4 (VEE) each have a portion projecting more than pin-2 (IN1−) and pin-3 (IN1+). Likewise, pin-5 (IN2+) and pin-8 (VCC) each have a portion projecting more than pin-6 (IN2−) and pin-7 (OUT2).

Further, in terms of the leftward and rightward directions in the sheet on which the figure is drawn, pin-1 (OUT1) and pin-4 (VEE) each have a part thereof overlapping with an island 310. Likewise, pin-5 (IN2+) and pin-8 (VCC) each have a part thereof overlapping with the island 310.

Furthermore, between pin-1 (OUT) and pin-8 (VCC) and between pin-4 (VEE) and pin-5 (IN2+), there are formed support frames 330 and 340, respectively, to support the island 310.

Figure 16:
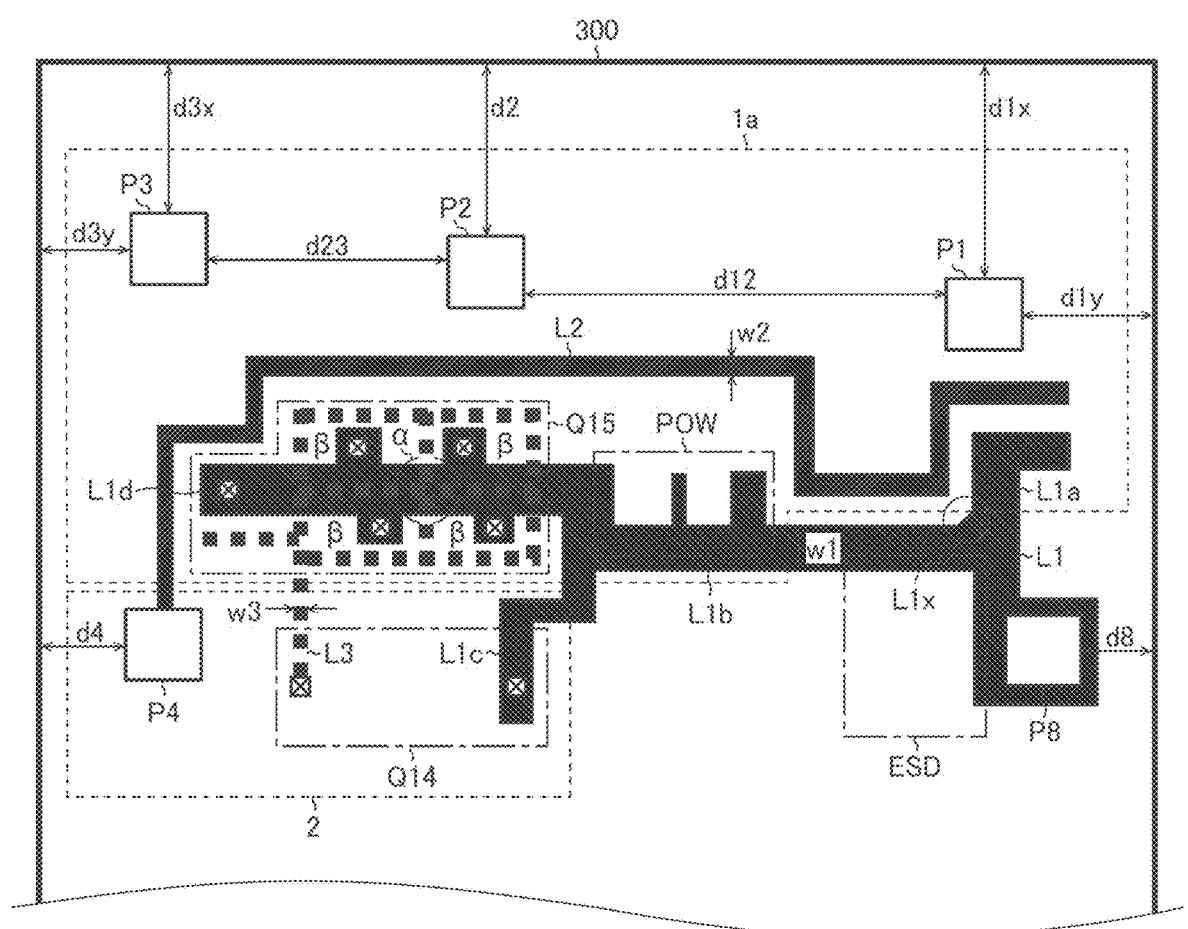
FIG. 16 is a plan view showing an example of a wiring layout and of a pad arrangement.

FIG. 16 is a plan view showing an example of a wiring layout and a pad arrangement (around the operational amplifier 1a) on the semiconductor chip 300. Here, in the present figure, the power supply line L1 (width w1) and the ground line L2 (width w2) laid in the second wiring layer are each illustrated with solid lines (hatching regions), and the reference current setting line L3 (width w3) laid in the first wiring layer (=directly under the second wiring layer) is illustrated in short-dash line in a see-through manner. As to the widths w1 to w3 of these lines, it is preferable to design such that the width w2 of the ground line L2 and the width w3 of the reference current setting line L3 are each narrower than (for example, equal to or less than half) the width w1 of the power supply line L1, for example, such that w1=20 μm, w2=5 μm, and w3=5 μm.

In the following description, the upward, downward, leftward, and rightward directions in the sheet on which the figure is drawn are defined as the upward, downward, leftward, and rightward directions in plan view of the semiconductor chip 300, and the wiring layout and the pad arrangement will be described with reference also to FIG. 4, FIG. 6, and FIG. 15, as necessary, which have been referred to previously.

As pads relating to the operational amplifier 1a, the present figure illustrates the pads P1 to P4, and P8. Here, in the plan view of the semiconductor chip 300, the positions at which the pads P1 to P4 and P8 are provided correspond to the positions indicated in FIG. 15 referred to previously.

Specifically, as to the pads P1 to P3, in plan view of the semiconductor chip 300, the pad P1, the pad P2, and the pad P3 are arranged in this order from the right side toward the left side of the sheet on which the figure is drawn.

More specifically, the pad P1 is provided near the upper right corner of the semiconductor chip 300. The pad P2 is provided near the upper side of the semiconductor chip 300, at a position slightly to the left of the center in the left-right direction. The pad P3 is provided near the upper left corner of the semiconductor chip 300.

Of the pads P1 to P3, the pad P1 is located farthest from the upper side of the semiconductor chip, and the pad P3 is located nearest to the upper side of the semiconductor chip 300. That is, where a distance between the pad P1 and the upper side of the semiconductor chip 300 is represented by d1x, a distance between the pad P2 and the upper side of the semiconductor chip 300 is represented by d2, and a distance between the pad P3 and the upper side of the semiconductor chip 300 is represented by d3x, d1x>d2>d3x holds.

Further, a distance d1y between the pad P1 and the right side of the semiconductor chip 300 is longer than a distance d3y between the pad P3 and the left side of the semiconductor chip 300 (d1y>d3y).

A distance d12 between the pads P1 and P2 is longer than a distance d23 between the pads P2 and P3 (d12>d23).

In plan view of the semiconductor chip 300, the pad P4 is provided near the left side of the semiconductor chip 300, substantially at the center in the up-down direction. Here, a distance d4 between the pad P4 and the left side of the semiconductor chip 300 is substantially equal to the distance d3y between the pad P3 and the left side of the semiconductor chip 300 (d4≈d3y).

In plan view of the semiconductor chip 300, the pad P8 is provided near the right side of the semiconductor chip 300, substantially at the center in the up-down direction. Here, a distance d8 between the pad P8 and the right side of the semiconductor chip 300 is shorter than the distance d1y between the pad P1 and the right side of the semiconductor chip 300 (d8<d1y).

Here, the pads P1 to P3 are all arranged within the region where the operational amplifier 1a is formed. On the other hand, the pad P4 is arranged in the region where the reference current setting portion 2 is formed.

The power supply line L1 is laid from the pad P8 (VCC) toward the emitters of the transistors Q14 and Q15 and various components (such as a power transistor POW) of the operational amplifier 1a. Specifically, the power supply line L1 first extends from the pad P8 toward the upper side of the semiconductor chip 300, and then branches into a first line L1a extending toward the upper side of the semiconductor chip 300 and a second line L1b extending toward the left side of the semiconductor chip 300. In the branching portion from which the first line L1a and the second line L1b extend separately, a tapered portion L1x is formed at the upper left corner. Further, near the pad P8 (VCC), an electrostatic protection element ESD is formed.

The first line L1a, after being separated from the second line L1b, is bent toward the right side of the semiconductor chip 300. On the other hand, the second line L1b, after the transistor POW, branches into a third line L1c, which changes the direction of its course to a direction toward the lower side of the semiconductor chip and further extends toward the emitter of the transistor Q14, and a fourth line L1d, which continuously extends in a direction toward the left side of the semiconductor chip 300 and further extends toward the emitter of the transistor Q15. Here, within the range where the transistor Q15 is formed, the fourth line L1d is formed in a comb teeth shape. The teeth parts (the parts projecting in the up-down direction) and the main axis part (the part extending in the left-right direction) of the thus formed fourth line L1d, are respectively connected to the emitters of a plurality of unit transistors of the transistor Q15. Thus, the transistor Q15 is composed of the plurality of unit transistors, and current mirrors formed by using the unit transistors function as the current sources I1 to I7 (see FIG. 4 referred to previously).

The ground line L2 is laid from the pad P4 (VEE) toward various components of the semiconductor chip 300. Specifically, the ground line L2 first extends from the pad P4 toward the upper side of the semiconductor chip 300, then, before the pad P3, changes the direction of its course to a direction toward the right side of the semiconductor chip 300, passes through a region between the power supply line L1 and the pads P1 to P3, while being bent several times, and then reaches a position near the right side of the semiconductor chip 300.

The reference current setting line L3 is laid between the bases of the transistors Q14 and Q15, which are arranged side by side in the up-down direction of the semiconductor chip 300. More specifically, the reference current setting line L3 is laid not only along the shortest route between the bases of the transistors Q14 and Q15 but also along a bypass route, part of which is parallel to the power supply line L1 (the fourth line L1d). The reference current setting line L3 is also laid such that centers of the reference current setting line L3 and the power supply line L1 (the fourth line L1d) overlap with each other.

Thus, the power supply line L1 and the reference current setting line L3 are laid one above the other so as to partially overlap with each other in plan view of the semiconductor chip 300 (see, for example, a region α). This makes it possible to use the parasitic capacitor between the power supply line L1 and the reference current setting line L3 as the capacitor C4 described previously.

In particular, in the reference current setting line L3, its part overlapping with the power supply line L1 is laid in a grid pattern. This wiring layout makes it possible to increase the overlapping area over which the power supply line L1 and the reference current setting line L3 overlap with each other.

Here, in the grid-pattern part of the reference current setting line L3, the plurality of unit transistors forming the transistor Q15 can be respectively arranged in a plurality of regions β enclosed by the reference current setting line L3.

Further, it is desirable that the proportion of an area occupied by the power supply line L1 in each of the plurality of regions β be ½ or more.

Further, it is desirable to provide, between the power supply line L1 and the pads P1 to P3 (and the constituent elements of the operational amplifier 1a connected to these), a shield member (the ground line L2 in this figure) that prevents electromagnetic interference between them.

Here, although the illustration in the present figure is focused on the operational amplifier 1a, the same wiring layout and the same pad arrangement as illustrated in the figure can be adopted also for the operational amplifier 1b. Specifically, as is clear from comparison between the pads P1 to P3 and the pads P5 to P7 illustrated in FIG. 15 referred to previously, the wiring layout and the pad arrangement described above can be reversed in the up-down direction in the sheet on which the figure is drawn.

Figure 17:
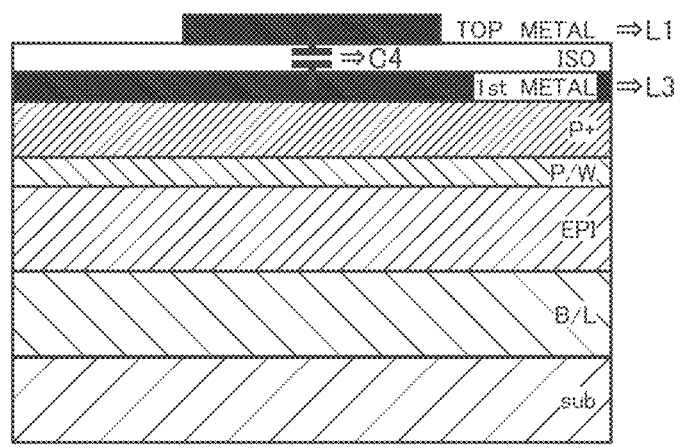
FIG. 17 is a vertical sectional view showing a formation example of a capacitor.

FIG. 17 is a vertical sectional view showing a formation example of the capacitor C4 in the region α. As shown in the figure, in the region α of the semiconductor chip 300, a p-type semiconductor substrate (P-sub), an n-type buried layer (B/L), an n-type epitaxial growth layer (EPI), a p-type well (P/W), a high-concentration p-type semiconductor region (P+), a first metal layer (1st METAL), an insulation layer (ISO), and a top metal layer (TOP METAL) are formed one on another in this order upward from the bottom.

Here, the power supply line L1 is laid by using the top metal layer (TOP METAL), and the reference current setting line L3 is laid by using the first metal layer (1st METAL). Accordingly, in the region α where the power supply line L1 and the reference current setting line L3 overlap with each other in the vertical direction, the capacitor C4 is formed with the top metal layer (TOP METAL) and the first metal layer (1st METAL) as electrodes and the insulation layer (ISO) between these metal layers as a dielectric body.

<Application to Vehicle>

Figure 18:
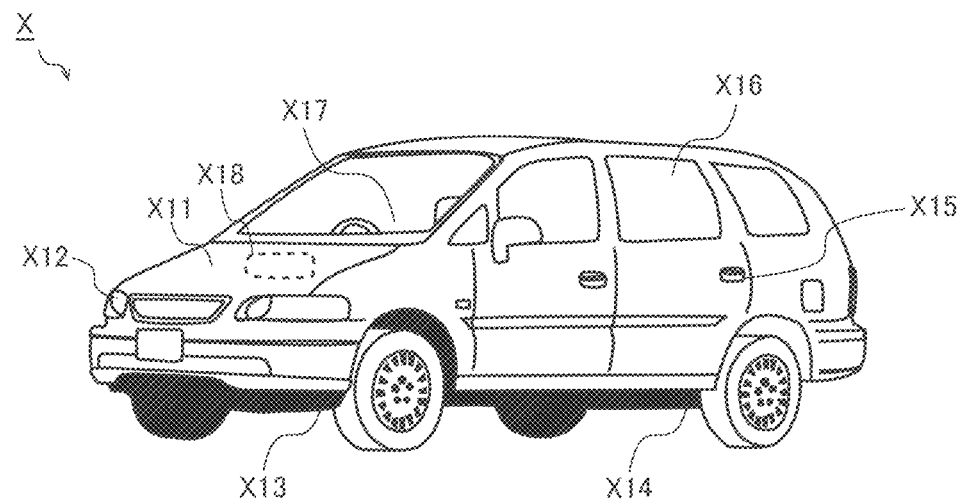
FIG. 18 is an exterior view of a vehicle.

FIG. 18 is an exterior view showing a configuration example of a vehicle X. The vehicle X of the present configuration example has mounted therein various electronic appliances (X11 to X18) that operate by being supplied with a power supply voltage from a battery. Here, for convenience of illustration, mounting positions of the electronic appliances X11 to X18 in the present figure may be different from reality.

The electronic appliance X11 is an engine control unit which performs engine-related controls (injection control, electronic throttle control, idling control, oxygen sensor heater control, auto cruise control, etc.).

The electronic appliance X12 is a lamp control unit which performs lighting-on-and-off control with respect to an HID (high intensity discharged lamp), a DRL (daytime running lamp), etc.

The electronic appliance X13 is a transmission control unit which performs transmission-related control.

The electronic appliance X14 is a braking unit which performs controls (an ABS (anti-lock brake system) control, an EPS (electric power steering) control, electronic suspension control, etc.) relating to the motion of the vehicle X.

The electronic appliance X15 is a security control unit which performs driving control with respect to a door lock, a security alarm, etc.

The electronic appliance X16 is an electronic appliance incorporated in the vehicle X at the stage of shipment from the factory as standard equipment or as the manufacturer's option item, such as a wiper, an electric door mirror, a power window, a damper (shock absorber), an electric sunroof, an electric seat, or the like.

The electronic appliance X17 is an electronic appliance which is mounted as necessary in the vehicle X as a user's option item, such as an in-vehicle A/V (audio/visual) appliance, a car navigation system, an ETC (electronic toll collection) system, or the like.

The electronic appliance X18 is an electronic appliance provided with a high voltage motor, such as an in-vehicle blower, an oil pump, a water pump, a battery cooling fan, or the like.

Note that the operational amplifier IC10 described previously is mountable in any of the electronic appliances X11 to X18.

Other Modified Examples

The embodiments discussed above have dealt with examples where an operational amplifier is used in an in-vehicle appliance, but this is not intended to limit the application of the present invention, and the present invention is widely and generally applicable to any applications including home electric appliances, industrial appliances, etc.

Further, in addition to the above embodiments, it is possible to add various modifications to the various technical features disclosed herein without departing from the spirit of the technological creation. For example, bipolar and MOS field-effect transistors may be interchanged, and the logic level of any signal may be inverted as necessary. That is, it should be understood that the above embodiments are illustrative in all respects and are not intended to limit the present invention; the technological scope of the present invention is not indicated by the above description of the embodiments but by the claims; and all modifications within the scope of the claims and the meaning equivalent to the claims are covered.

INDUSTRIAL APPLICABILITY

The operational amplifier disclosed herein is usable in, for example, in-vehicle appliances, home electric appliances, and industrial appliances.

LIST OF REFERENCE SIGNS 1, 1a, and 1b operational amplifier
2 reference current setting portion
3 wiring
4 element
10 semiconductor device (operational amplifier IC)
100 measurement circuit (DPI test)
101 signal generator
102 amplifier
103 attenuator
104 bias tee
105 battery
106 direct current power supply
107 oscilloscope
200 measurement circuit (radio emission test)
201 signal generator
202 amplifier
203 antenna
204 pseudo-power supply
205 wire harness
206 oscilloscope
207 anechoic chamber
300 semiconductor chip
310 island
320 mold resin
330, 340 support frame
C0, C1, C2, Cx, Cy, Cz parasitic capacitor
C3 capacitor
C4 capacitor (parasitic capacitor)
D1, D electrostatic protection diode
ESD electrostatic protection element
I1 to I7 current source
L1 power supply line
L1a first line
L1b second line
L1c third line
L1d fourth line
L1x tapered portion
L2 ground line
L3 reference current setting line
L4 output line
P1 to P8 pad
POW power transistor
Q1 to Q6, Q14, Q15 pnp bipolar transistor
Q7 to Q13, Q16 npn bipolar transistor
R0 resistor (power supply resistor)
R1, R2 resistor (input resistor)
R3 resistor
W1 to W8 wire
X vehicle
X11 to X18 electronic appliance
α,β region

The invention claimed is:
1. A semiconductor device comprising:
an operational amplifier;

a reference current setting portion configured to set a reference current of the operational amplifier;

a power supply line configured to be laid between a power supply terminal and each of the operational amplifier and the reference current setting portion;

a ground line configured to be laid between a ground terminal and each of the operational amplifier and the reference current setting portion; and a reference current setting line configured to be laid between the operational amplifier and the reference current setting portion, wherein the operational amplifier comprises:
 a transistor configured to form an input stage; and
 an input resistor configured to form a filter together with a parasitic capacitor of the transistor, wherein in plan view of the semiconductor device, the power supply line and the reference current setting line are laid one above another so as to partially overlap with each other, and wherein, in plan view of the semiconductor device, a part of the reference current setting line that overlaps with the power supply line is laid in a grid pattern.

2. The semiconductor device according to claim 1, wherein a resistance value R of the input resistor is set based on a capacitance value C of the parasitic capacitor and a target cutoff frequency fc of the filter such that R=1/(2π·fc·C).

3. The semiconductor device according to claim 1, wherein the operational amplifier further comprises a power supply resistor configured to form a filter together with a parasitic capacitor of the power supply line.

4. The semiconductor device according to claim 1, further comprising a capacitor configured to be connected between the power supply line and the reference current setting line.

5. The semiconductor device according to claim 4, wherein the capacitor is a parasitic capacitor between the power supply line and the reference current setting line.

6. The semiconductor device according to claim 1, wherein, in plan view of the semiconductor device, in a region enclosed by the reference current setting line laid in the grid pattern, a transistor is formed which functions as a reference current source of the operational amplifier.

7. The semiconductor device according to claim 6, wherein
 the transistor is composed of a plurality of unit transistors, and
 in plan view of the semiconductor device, the plurality of unit transistors are respectively formed in a plurality of regions enclosed by the reference current setting line laid in the grid pattern.

8. The semiconductor device according to claim 1, wherein, in plan view of the semiconductor device, a proportion of an area occupied by the power supply line in a region enclosed by the reference current setting line laid in the grid pattern is equal to or more than ½.

9. The semiconductor device according to claim 5, wherein
 the reference current setting line is laid using a first wiring layer,
 the power supply line is laid using a second wiring layer,
 the capacitor is formed in a region where the power supply line and the reference current setting line overlap with each other, with the first wiring layer and the second wiring layer as electrodes, and with an insulating layer laid between the electrodes as a dielectric body.

10. The semiconductor device according to claim 1, wherein a width of the ground line and a width of the reference current setting line are each narrower than a width of the power supply line.

11. An electronic appliance comprising the semiconductor device according to claim 1.

12. A vehicle comprising the electronic appliance according to claim 11.

13. The semiconductor device according to claim 1, further comprising a shield member configured to be inserted between the power supply line and each of another wiring and another element.

14. A semiconductor device comprising:
an operational amplifier;
a reference current setting portion configured to set a reference current of the operational amplifier;
a power supply line configured to be laid between a power supply terminal and each of the operational amplifier and the reference current setting portion;
a ground line configured to be laid between a ground terminal and each of the operational amplifier and the reference current setting portion; and
a reference current setting line configured to be laid between the operational amplifier and the reference current setting portion,
wherein the operational amplifier comprises:
 a transistor configured to form an input stage; and
 an input resistor configured to form a filter together with a parasitic capacitor of the transistor, and
wherein the semiconductor device further comprises a shield member configured to be inserted between the power supply line and each of another wiring and another element.

15. The semiconductor device according to claim 14, wherein the shield member is the ground line.

16. The semiconductor device according to claim 14, wherein the width of the ground line and the width of the reference current setting line are each equal to or less than half the width of the power supply line.

17. The semiconductor device according to claim 14, wherein the semiconductor device comprises, integrated therein, a plurality of channels of the operational amplifier.

18. The semiconductor device according to claim 17, wherein external terminals for a first channel are provided on a first side of a package, and external terminals for a second channel are provided on a second side of the package.

19. The semiconductor device according to claim 14, wherein, in plan view of the semiconductor device, a proportion of an area occupied by the power supply line in a region enclosed by the reference current setting line laid in the grid pattern is equal to or more than ½.

20. The semiconductor device according to claim 14, wherein a width of the ground line and a width of the reference current setting line are each narrower than a width of the power supply line.

* * * * *